United States Patent [19]

Lamprecht

[11] 4,005,343
[45] Jan. 25, 1977

[54] CIRCUIT FOR PRODUCING A SPARK DISCHARGE

[75] Inventor: Adolf Lamprecht, Hausen, Germany

[73] Assignee: Rowenta-Werke GmbH, Offenbach (Main), Germany

[22] Filed: Apr. 18, 1975

[21] Appl. No.: 569,586

[30] Foreign Application Priority Data

Apr. 23, 1974 Germany .......................... 2419403

[52] U.S. Cl. .................................. 317/96; 431/264
[51] Int. Cl.² ....................... F23Q 2/28; F23Q 3/01
[58] Field of Search ...................................... 317/96

[56] References Cited

UNITED STATES PATENTS 3,781,163  12/1973  Ovens ............................... 317/96 X
3,883,246  5/1975  Mere ................. 317/96 X

*Primary Examiner*—Robert Segal
*Attorney, Agent, or Firm*—George R. Clark; Neil M. Rose; Clifford A. Dean

[57] ABSTRACT

A circuit for producing a spark discharge, for example for a lighter, comprises a capacitor chargeable via a voltage converter from a d.c. source and connected to a discharge circuit via an automatically triggerable switch, the switch being connected to means for automatically turning off the voltage converter to automatically turn off the converter upon triggering of the switch.

1 Claim, 1 Drawing Figure

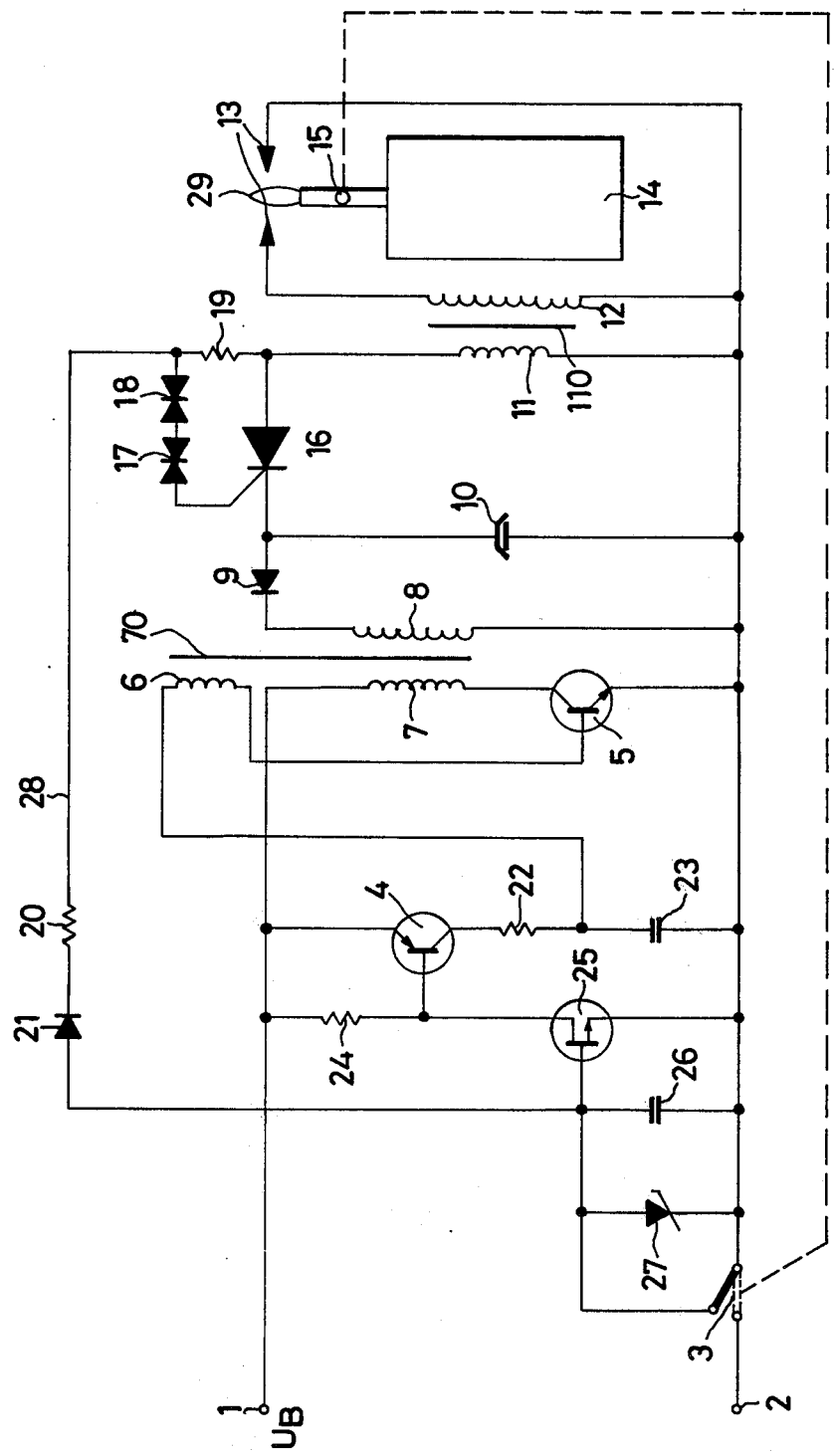

CIRCUIT FOR PRODUCING A SPARK DISCHARGE

This invention relates to a circuit for producing a spark discharge.

A known circuit for producing spark discharges includes an ignition capacitor which is chargeable, via a voltage converter and a switch, from a direct current source, and which may be connected to a discharge circuit via an electrically automatically triggered switch.

Such circuits may advantageously be used, not only in small electric lighters, for example pocket lighters, but also in battery-operated flash-light apparatus or apparatus in which the discharge of a capacitor is used to fire a flash-tube, for example. Although only very little electrical energy is required for each high voltage discharge, difficulties arise, for example in providing the magnitudes of current and voltage required for high voltage ignition from a single cell.

The problem is not only to convert the very low output voltage of a singly cell into the contrastingly very high ignition voltage of between 8,000 and 10,000 volts, but also care must be taken that the electrical energy stored in a single cell is not uselessly wasted; as is the case, for example, in a known ignition circuit for a lighter in which a d.c. to d.c. convertor is switched on by means of a key, then charges the ignition capacitor and subsequently is switched off by release of the key.

In this case, the convertor operates even when the lighter is in operation and thus pointlessly discharges the single cell. The result is the continued production of electrical high voltage sparks, even during the period when the gas flame is already burning.

An improved circuit has become known, in which the d.c. to d.c. converter is switched off as soon as discharge of the ignition capacitor has been effected - even before it has been switched off by release of the operating key. For this, a threshold switch connected to the control circuit of the converter is used, this switch interrupting the oscillation of the convertor when the ignition capacitor is discharged (Austrian Patent Application A 2056/73). In particular, the threshold switch consists of a capacitor arranged in the control circuit of the convertor and a resistor in the discharge circuit of the ignition capacitor, which is connected to the capacitor via a diode connected to it in its anode circuit. A disadvantage of this circuit arrangement is that, in order to interrupt the oscillation of the convertor, a particular electrolytic capacitor has to be charged from the ignition capacitor, and that, for this, a fall in voltage is produced across a resistor, and that the converter is not turned off until during the discharge process of the ignition capacitor. Even if the absolute energy loss in the ignition circuit is very low, nevertheless, in a circuit of this known kind, in the long term the energy loss is disturbingly significant.

In addition, the ignition capacitor has to feed not only the ignition circuit but also a relatively complicated circuit for turning off the converter. Finally, the circuit elements in the known circuit arrangements are not suitable for minaturisation for example in the form of a thick-film circuit.

By contrast, the invention has as its object to provide a circuit of the same kind, wherein the voltage converter can be turned-off more easily and without significant loss of energy.

According to the invention, there is provided a circuit for producing a spark discharge, comprising a capacitor connected so as to be chargeable via a voltage converter from a d.c. source and connected to a discharge circuit via an electrically automatically triggerable switch, the switch being coupled to means for automatically turning off the voltage converter, whereby the means for automatically turning off the voltage converter is actuated upon triggering of the said switch.

It is advantageous that the voltage converter is turned off before or at any rate at the same time as the switching-on of the discharge circuit.

In a preferred embodiment, the voltage converter includes a transformer having a feedback winding and the means for automatically turning off the converter includes a control transistor coupled to said feedback winding, field-effect transistor being connected in the base circuit of the control transistor.

The advantage of the field effect transistor lies in the fact that it can in practice be switched on by low energy pulses. A capacitor is preferably connected to the control input of the field effect transistor and advantageously a zener diode is connected in parallel with the capacitor. Preferably, a small capacitor of the order of a nanofarad is used. This can easily be provided in a thick-film circuit.

In a particularly preferred form, the automatically triggerable switch comprises a pair of trigger diodes and a current-limiting resistor connected in series between the anode and the gate of a thyristor. The junction of the trigger diodes with the current-limiting resistor is coupled to the control input of the field-effect transistor.

In operation, the capacitor is charged via the voltage converter while the thyristor is cut off. When the trigger diodes conduct, the thyristor fires and a pulse is coupled to the control input of the field-effect transistor. The capacitor discharges into the discharge circuit and the converter is turned off by the control transistor.

An embodiment of the invention will now be described by way of example and with reference to the accompanying drawing which is a schematic diagram of a circuit according to the invention employed in a lighter.

The circuit may be connected to a relatively low voltage source such as a single cell (not shown) via the terminals 1 and 2 and converts the relatively low voltage into high ignition voltage of about 8,000 to 10,000 V for the ignition electrodes 13. For this, a single-ended voltage converter including an n-p-n switching transistor 5 is used. One end of the primary winding 7 of a converter transformer 70 is connected to the collector of the transistor 5, the other end being connected to the terminal 1. The emitter of the convertor transistor 5 is connected to earth, while its base is connected via a feedback winding 6 to a capacitor 23 and via a resistor 22 to the collector of a p-n-p control transistor 4. The base voltage of transistor 4 is determined by a resistor 24 and a field-effect transistor 25, the gate of which is connected to a capacitor 26 with a parallel-connected zener diode 27. The terminal 2 is connected to the circuit via a switch 3 which is constructed as a changeover switch, and which, in its rest position, short-circuits the capacitor 26.

A secondary winding 8 of the converter transformer 70 supplies, via a diode 9, the ignition capacitor 10, which in turn is connected, via an automatically triggerable switch 16, 17, 18, 19, to the primary winding 11 of an ignition transformer 110. Its secondary winding 12 is connected to the ignition electrodes 13, between which a high voltage spark jumps to ignite the gas mixture 29 from the gas tank 14. In the gas supply tube, a gas supply valve 15 is provided, which may be linked to the switch 3.

In the exemplary embodiment shown, the automatically triggerable switch consists of a thyristor 16 in combination with a pair of trigger diodes 17 and 18 and a current-limiting resistor 19. From the point of connection between the trigger diodes 17, 18 and the resistor 19, a control line 28 with a resistor 20 and a diode 21 leads to the gate of the field-effect transistor 25.

It its rest position, the switch 3 is in the position shown with continuous lines. The capacitor 26 is discharged. By operation of the handle of the lighter (not shown), the switch 3 is moved into the position indicated with a broken line, whereby the circuit is connected, for example, to a single cell (not shown). At the same time, as indicated by a broken line, the gas supply valve 15 may be operated, whereupon release of gas 29 from the gas tank 14 takes place between the ignition electrodes 13.

The field-effect transistor 25 conducts so that a base current determined chiefly by the resistor 24 is available at the base of the control transistor 4.

The control transistor 4 controls the switching transistor 5 via resistor 22 and capacitor 23 connected to the feedback winding 6, whereby the ignition capacitor 10 is charged, via the converter transformer 70 and the diode 9. The thyristor 16 in the ignition circuit meanwhile remains cut-off.

As soon as the ignition capacitor 10 has been charged to its rated voltage, a current can flow from the secondary winding 8 of the converter transformer 70 via the primary winding 11 of the ignition transformer 110, the current-limiting resistor 19 and the trigger diodes 17, 18 to the gate of the thyristor 16, whereupon the latter becomes conductive and triggers the discharge of the ignition capacitor 10 via the primary winding 11 of the ignition transformer 110.

Even before discharge of the ignition capacitor 10 occurs, a pulse passes via the control line 28, the resistor 20 and the diode 21 to the capacitor 26 which has a capacity of only a few nF. It charges up to the voltage determined by the zener diode 27 and cuts off the field-effect transistor 25. In this way, the oscillation of the d.c. to d.c. convertor is interrupted and any further useless removal of current from the single cell is prevented, even before the d.c. to d.c. convertor is turned off by opening the switch 3. The zener diode 27 may be omitted, if the resistor 20 is accordingly made large enough. The circuit according to the invention may be such that most of its circuit elements are particularly suitable for hybrid circuits.

What is claimed is:

1. A circuit for producing a spark discharge comprising, an ignition capacitor connected so as to be chargeable by a voltage converter from a d.c. source and connected to a discharge circuit through an automatically triggerable electric switch, said voltage converter comprising by a control transistor, a switching transistor, and a converter transformer having a feedback winding, said automatically triggerable electric switch comprising by a thyristor connected to said ignition capacitor and by a pair of trigger diodes and a current-limiting resistor connected in series between the anode and the gate of said thyristor, means for automatically turning off said voltage converter and simultaneously disconnecting said voltage converter from said d.c. source upon said electric switch being triggered, said latter means comprising a field-effect transistor having its collector and emitter connected across said d.c. source, having its collector connected to the base of said control transistor, and having its control input gate connected through a trigger path to a junction between said trigger diodes and said current-limiting resistor of said automatically triggerable electric switch, a capacitor connected to the control input gate of said field-effect transistor, and a zener diode connected in parallel with the capacitor connected to said field-effect transistor.

* * * * *